(12) United States Patent
Ohshima et al.

(10) Patent No.: US 10,105,966 B2
(45) Date of Patent: Oct. 23, 2018

(54) TREATMENT-TARGET MODIFICATION DEVICE, TREATMENT-TARGET MODIFICATION SYSTEM, IMAGE FORMING SYSTEM, AND IMAGE FORMING METHOD

(71) Applicants: Tohru Ohshima, Kanagawa (JP); Hiroyoshi Matsumoto, Kanagawa (JP)

(72) Inventors: Tohru Ohshima, Kanagawa (JP); Hiroyoshi Matsumoto, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 4 days.

(21) Appl. No.: 15/188,806

(22) Filed: Jun. 21, 2016

(65) Prior Publication Data

US 2017/0001453 A1    Jan. 5, 2017

(30) Foreign Application Priority Data

Jul. 2, 2015    (JP) ................. 2015/133894

(51) Int. Cl.
*B41J 2/01*    (2006.01)
*B41J 11/00*    (2006.01)
(Continued)

(52) U.S. Cl.
CPC ........... *B41J 11/0015* (2013.01); *B05D 3/142* (2013.01); *B41J 2/01* (2013.01); *B41J 2/2114* (2013.01); *B41J 2/2146* (2013.01); *B41M 5/0011* (2013.01); *H01J 37/32073* (2013.01); *H01J 37/32348* (2013.01); *H01J 37/32889* (2013.01); *H01J 37/32972* (2013.01);
(Continued)

(58) Field of Classification Search
CPC ........ B41J 2/01; B41J 11/0015; B41J 2/2114; B41J 2202/21; B41J 2/2146; H01J 2237/327; H01J 2237/336; H01J 37/32073; H01J 37/32348; H01J 37/3277; H01J 37/32889; H01J 37/32972; B41M 5/0011; B41M 5/0017; B05D 3/142
USPC ....................... 347/20, 21, 96, 101
See application file for complete search history.

(56) References Cited

U.S. PATENT DOCUMENTS

2004/0055698 A1    3/2004    Tran et al.
2006/0017957 A1*   1/2006    Degott .................... B41M 3/14
                                                    358/1.14
(Continued)

FOREIGN PATENT DOCUMENTS

CN    1085655 A    4/1994
CN    102124398 B    7/2011
(Continued)

OTHER PUBLICATIONS

European Search Report; Application No. 16175972.5-1701; dated Jan. 5, 2017.
Chinese Office Action; Appl 201610509520.4 dated Jan. 26, 2018.

*Primary Examiner* — Jannelle M Lebron
(74) *Attorney, Agent, or Firm* — Duft & Bornsen, PC

(57) ABSTRACT

A treatment-target modification device is configured to modify a treatment target being conveyed, with discharge. The treatment-target modification device includes: a hydrophilization unit configured to perform hydrophilization treatment on the treatment target (20; and a measurement unit configured to measure two-dimensional distribution of a reflectance spectrum of light reflected from the hydrophilization-treated treatment target.

10 Claims, 8 Drawing Sheets

(51) Int. Cl.
  *H01J 37/32* (2006.01)
  *B05D 3/14* (2006.01)
  *B41M 5/00* (2006.01)
  *B41J 2/21* (2006.01)

(52) U.S. Cl.
  CPC ........ *B41J 2202/21* (2013.01); *H01J 37/3277* (2013.01); *H01J 2237/327* (2013.01); *H01J 2237/336* (2013.01)

(56) References Cited

U.S. PATENT DOCUMENTS

| | | |
|---|---|---|
| 2009/0290007 A1 | 11/2009 | Saitoh et al. |
| 2010/0302660 A1 | 12/2010 | Hirokubo et al. |
| 2014/0078212 A1 | 3/2014 | Nakai et al. |
| 2014/0160197 A1 | 6/2014 | Hirose et al. |
| 2015/0035918 A1 | 2/2015 | Matsumoto et al. |
| 2015/0077458 A1 | 3/2015 | Osanai et al. |
| 2015/0251453 A1 | 9/2015 | Nakai et al. |
| 2015/0258811 A1 | 9/2015 | Hiratsuka et al. |
| 2015/0258813 A1 | 9/2015 | Saitoh et al. |
| 2015/0266311 A1 | 9/2015 | Hirose et al. |
| 2015/0266312 A1 | 9/2015 | Yamanaka et al. |
| 2016/0009107 A1 | 1/2016 | Nakai et al. |
| 2016/0096377 A1 | 4/2016 | Katoh et al. |
| 2016/0167402 A1 | 6/2016 | Nakai et al. |

FOREIGN PATENT DOCUMENTS

| | | |
|---|---|---|
| CN | 102822407 A | 12/2012 |
| CN | 204346906 U | 5/2015 |
| EP | 2554732 A1 | 2/2013 |
| JP | 2005-350615 | 12/2005 |
| JP | 2013-193291 | 9/2013 |
| JP | 2014-016618 | 1/2014 |
| JP | 2014-076658 | 5/2014 |
| JP | 2014-133406 | 7/2014 |
| JP | 2015057309 A | 3/2015 |

\* cited by examiner

TREATMENT-TARGET MODIFICATION DEVICE, TREATMENT-TARGET MODIFICATION SYSTEM, IMAGE FORMING SYSTEM, AND IMAGE FORMING METHOD

CROSS-REFERENCE TO RELATED APPLICATIONS

The present application claims priority under 35 U.S.C. § 119 to Japanese Patent Application No. 2015-133894 filed on Jul. 2, 2015. The contents of which are incorporated herein by reference in their entirety.

BACKGROUND OF THE INVENTION

1. Field of the Invention

The present invention relates to a treatment-target modification device, a treatment-target modification system, an image forming system, and an image forming method.

2. Description of the Related Art

In typical inkjet recording apparatuses known to the inventors, a shuttle method in which a head is reciprocated in a width direction of a recording medium, typified by paper and a film, is a mainstream method, which makes it difficult to increase print speed to increase throughput. Under the circumstance, a single-pass method in which a plurality of heads are disposed to cover a full width of a recording medium and recording is performed using the heads at one time to achieve high-speed printing is proposed in recent years.

Relevant techniques are found in Japanese Laid-open Patent Publication No. 2013-193291, Japanese Laid-open Patent Publication No. 2005-350615, and Japanese Laid-open Patent Publication No. 2014-16618.

Although the single-pass method is advantageous in speed-up, because a time interval between ejection of ink for adjacent dots is short and therefore the ink for the adjacent dot is ejected before the ink previously ejected is fixed, coalescence of the adjacent dots (hereinafter, "ejected droplet interference") is likely to occur, resulting in degradation in image quality.

SUMMARY OF THE INVENTION

According to one aspect of the present invention, a treatment-target modification device is configured to modify a treatment target being conveyed, with discharge. The treatment-target modification device includes a hydrophilization unit and a measurement unit. The hydrophilization unit is configured to perform hydrophilization treatment on the treatment target. The measurement unit is configured to measure two-dimensional distribution of a reflectance spectrum of light reflected from the hydrophilization-treated treatment target.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DETAILED DESCRIPTION OF THE PREFERRED EMBODIMENTS

Figure 1:
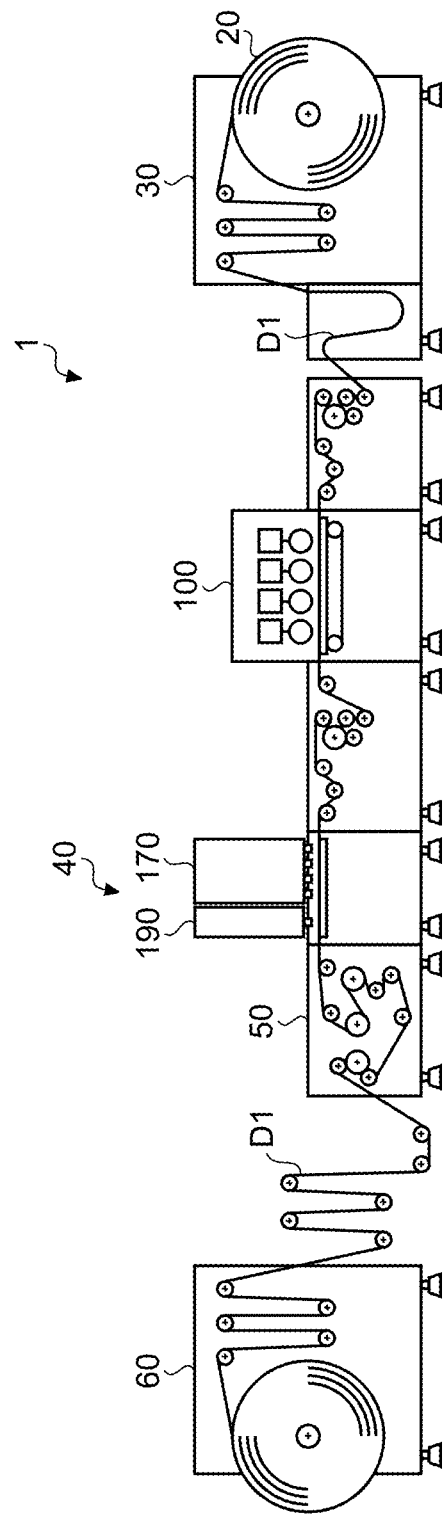
FIG. 1 is a diagram illustrating an example schematic configuration of a printing apparatus (system) according to an embodiment of the present invention.

The terminology used herein is for the purpose of describing particular embodiments only and is not intended to be limiting of the present invention.

As used herein, the singular forms "a", an and the are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

Preferred embodiments of the present invention are described in detail below with reference to the accompanying drawings. The embodiments described below are preferred embodiments of the present invention and therefore various technically preferred limitations are imposed. However, the embodiments described below should not be construed as unduly limiting the scope of the present invention.

It should not be construed that all of elements of the embodiments described below are essential to the invention.

An embodiment has an object to provide a treatment-target modification device, a treatment-target modification system, an image forming system, and an image forming method that enable high-quality printing.

Techniques applicable for reducing degradation in image quality caused by ejected droplet interference include a method of applying precoat or performing hydrophilization treatment (or acidification treatment), such as corona treatment and plasma treatment, on a recording medium (hereinafter, may be referred to as "treatment target"). This method is hereinafter referred to as "pretreatment". The method of performing pretreatment on a treatment target is required to achieve a high level of treatment uniformity in the treated surface. This is because variation in dot gain or the like resulting from non-uniform treatment can develop density non-uniformity in image formation and degrade quality.

However, because methods of performing pretreatment on a treatment target typically do not change appearance of a treated surface, it is difficult to make a quick evaluation of treatment uniformity. For example, to evaluate appropriateness of a level of corona treatment performed on a film base, a method using wettability-test liquid, a method of measuring a contact angle of a droplet of solvent, or the like is typically used. However, it is difficult to evaluate uniformity of the entire treated surface with these methods. Therefore, in practice, it is required to repeatedly perform printing for image quality check and adjust the treatment conditions according to a print result to optimize treatment conditions; as a result, operating efficiency is disadvantageously decreased. There is another problem in terms of reliability, for example, if, during printing, the treatment conditions should change due to a change in room humidity or the like, dot gain changes and therefore print quality disadvantageously changes.

In the embodiments below, by way of illustrative examples, a treatment-target modification device, a treatment-target modification system, an image forming system, and an image forming method that increases treatment uniformity to enable high-quality printing are described.

In the embodiments described below, a spectrum (a reflectance spectrum) of light reflected from a pretreated treatment target is measured and treatment uniformity is evaluated based on a result of the measurement. The wavelength to be measured can be any wavelength or wavelength range where variation in reflectance between before and after pretreatment is produced. A hyperspectral camera, for example, can be used to measure the reflectance spectrum. A hyperspectral camera is an analyzing means attracting attention in recent years and is a technique of obtaining reflectance spectrum information for each of two-dimensionally arrayed pixels, thereby enabling visualization of two-dimensional distribution of a reflectance spectrum. Treatment uniformity can be quantified and visualized using such a hyperspectral camera as an evaluation means. For instance, by using a hyperspectral camera as an evaluation means, it is possible to evaluate uniformity of treatment, such as hydrophilization treatment, that does not involve a color change of a treatment target and is difficult to visualize even using a reagent for causing a color change, across an entire treated surface.

A treatment-target modification device, a treatment-target modification system, an image forming system, and an image forming method according to an embodiment of the present invention are described in detail below with reference to the accompanying drawings. In the embodiment described below, a treatment target is hydrophilized. Although, by way of illustration, plasma treatment is used as a hydrophilizing method, other hydrophilizing method, e.g., corona treatment, can be used.

In the embodiment, plasma energy is controlled so as to bring hydrophilicity of a treatment target surface within a target range to make gain of ink dots (hereinafter, simply referred to as "dots") uniform. As a result, because image problems, such as beading and bleeding, are reduced and uniform image density is obtained, a printout on which an image of high quality is formed can be obtained.

While an image forming apparatus including ejection heads (hereinafter, may be referred to as "print heads" or "ink heads") for four colors, which are black (K), cyan (C), magenta (M), and yellow (Y), is described in the embodiment, the ejection heads are not limited thereto. Specifically, the image forming apparatus may further include ejection heads for green (G), red (R), and another color(s); alternatively, the apparatus may include an ejection head(s) only for black (K). In the description given below, the letters K, C, M, and Y represent black, cyan, magenta, and yellow, respectively. In the embodiment, the printing apparatus (system), which is an image forming apparatus using the single-pass method, is described by way of example. However, the image forming apparatus is not limited thereto, and may be an image forming apparatus that uses a shuttle method or a transfer method.

In the embodiment, continuous paper rolled into a roll (hereinafter, "roll paper") is used as the treatment target. However, the treatment target is not limited thereto, and can be any recording medium, such as cut paper, on which an image can be formed. When paper is used as the treatment target, the paper may be, for example, ordinary paper, woodfree paper, recycled paper, thin paper, thick paper, or coated paper. The treatment target is not limited to paper. Any article, such as an overhead transparency film, a synthetic resin film, and a metal thin film, on the surface of which an image can be formed with ink or the like, can be used as the treatment target. The embodiment can provide greater advantage when the treatment target is paper, into which ink does not penetrate or penetrates slowly, such as coated paper. Although aqueous ink is used as ink in the embodiment, the ink is not limited thereto. The ink may be, for example, UV ink or solvent ink.

As illustrated in FIG. 1, a printing apparatus (system) 1 according to the embodiment includes a feed-in unit 30, a plasma treatment device 100, and an image forming unit 40. The feed-in unit 30 feeds in (conveys) a treatment target 20 (roll paper) along a conveyance path D1. The plasma treatment device 100 performs plasma treatment, as pretreatment, on the fed-in treatment target 20. The image forming unit 40 forms an image on a surface of the plasma-treated treatment target 20. The image forming unit 40 include an inkjet head 170 for forming an image on the plasma-treated treatment target 20 by inkjet processing. The image forming unit 40 may further include a post-processor 190 that performs post-processing on the treatment target 20 on which an image is formed.

The printing apparatus (system) 1 may further include a drier 50 and a feed-out unit 60. The drier 50 dries the post-processed treatment target 20. The feed-out unit 60 conveys out the treatment target 20, on which an image is formed (and on which post-processing may further be performed). The printing apparatus (system) 1 further includes a control unit (not illustrated) for controlling operations of various units.

In the embodiment, the printing apparatus (system) 1 illustrated in FIG. 1 performs treatment of hydrophilizing the surface of the treatment target 20 prior to an inkjet recording process as described above. As this treatment, for example, atmospheric-pressure non-equilibrium plasma treatment that makes use of dielectric barrier discharge can be employed. Hydrophilization treatment using atmospheric-pressure non-equilibrium plasma, where the electron temperature is extreme high and the gas temperature is close to ordinary temperature, is one of preferred plasma treatment methods for a treatment target, such as a recording medium.

Figure 2:
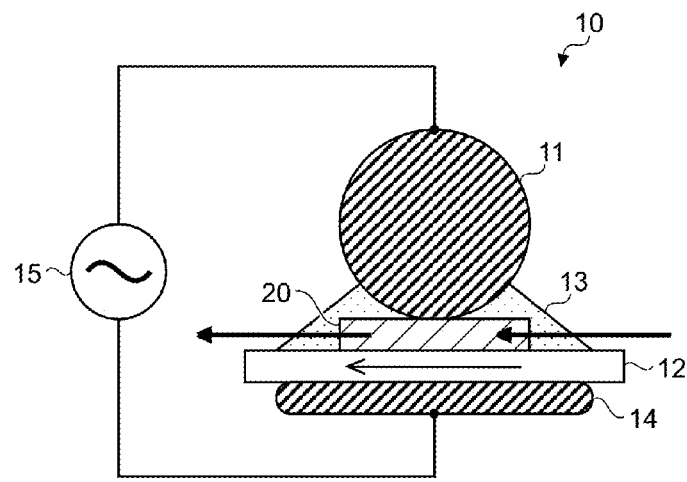
FIG. 2 is a schematic diagram illustrating an example schematic configuration of an atmospheric-pressure non-equilibrium plasma treatment device using streamer-breakdown-type dielectric barrier discharge.

It is preferable to perform atmospheric-pressure non-equilibrium plasma treatment using streamer-breakdown-type dielectric barrier discharge to produce atmospheric-pressure non-equilibrium plasma stably over a wide area. The streamer-breakdown-type dielectric barrier discharge can be produced by applying alternating high voltages between electrodes coated with a dielectric, for example. FIG. 2 is a schematic diagram illustrating an example schematic configuration of an atmospheric-pressure-non-equilibrium plasma treatment device using streamer-breakdown-type dielectric barrier discharge.

As illustrated in FIG. 2, the atmospheric-pressure-non-equilibrium plasma treatment device 10 includes a discharge electrode 11, a counter electrode 14, a dielectric 12, and a high-frequency, high-voltage power source 15. The dielectric 12 is interposed between the electrodes. Each of the discharge electrode 11 and the counter electrode 14 may be an electrode whose metal portion is exposed or an electrode covered with a dielectric or electrical insulator, such as insulation rubber and ceramic. The dielectric 12 interposed between the discharge electrode 11 and the counter electrode 14 may be an electrical insulator, such as polyimide, silicon, and ceramic. When corona discharge is employed as the plasma treatment, the dielectric 12 may be omitted. However, note that there can be a case where, as in a case where dielectric barrier discharge is employed, it is preferable to dispose the dielectric 12. In this case, effectiveness of the plasma treatment can be further increased by disposing the dielectric 12 in proximity of or in contact with the counter electrode 14 rather than in proximity of or in contact with the discharge electrode 11. This is because the area of surface discharge is increased by this arrangement. The discharge electrode 11 and the counter electrode 14 (or, when the dielectric 12 is disposed, the dielectric 12) may be positioned either so as to make a contact with the treatment target 20 conveyed between the two electrodes (or between the electrode and the dielectric 12) or so as not to make a contact therewith.

The method for producing atmospheric-pressure non-equilibrium plasma is not limited to the above-described streamer-breakdown-type dielectric barrier discharge, and various other methods are applicable. For instance, dielectric barrier discharge in which an electrical insulator, such as a dielectric, is inserted between electrodes, corona discharge that forms a highly non-uniform electric field in a thin metal wire or the like, or pulse discharge in which a short pulse voltage is applied, is applicable. A combination of two or more of these methods is also applicable.

Figure 3:
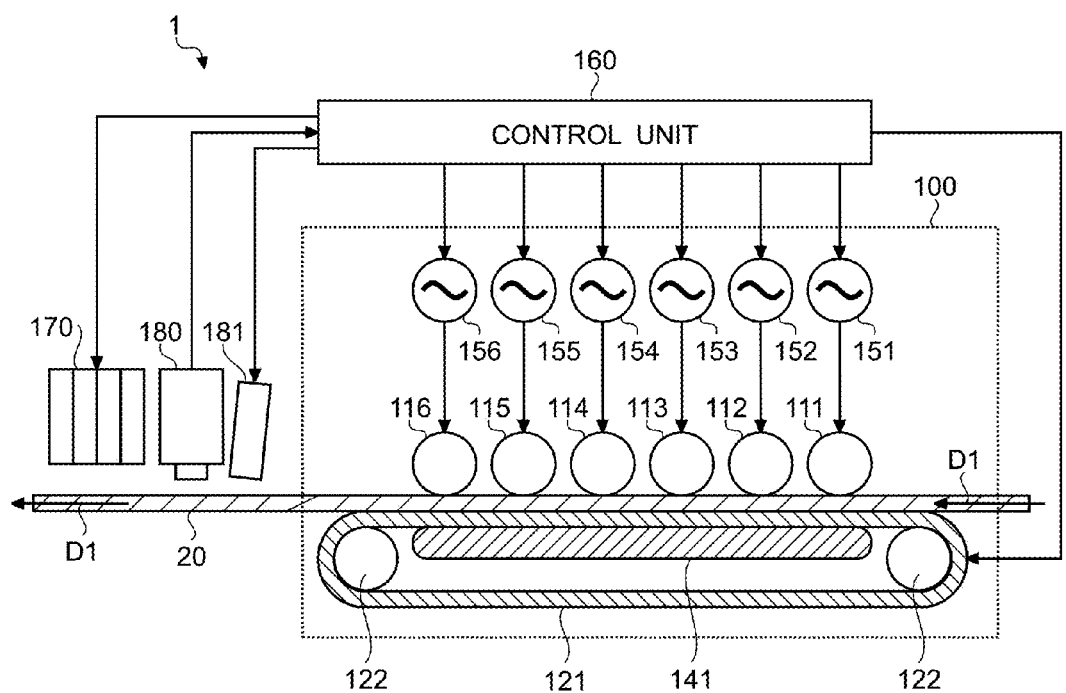
FIG. 3 is a schematic diagram illustrating an example schematic configuration of a portion, between the plasma treatment device and an inkjet recording device, of the printing apparatus (system) illustrated in FIG. 1.

An overview of the plasma treatment employed in the embodiment as an example of hydrophilization treatment is described in detail below with reference to the drawings. FIG. 3 is a schematic diagram illustrating an example schematic configuration of a portion, between the plasma treatment device 100 and the inkjet head 170, of the printing apparatus (system) 1 illustrated in FIG. 1. As illustrated in FIG. 3, the printing apparatus (system) 1 includes the plasma treatment device 100, a reflecting light source 181, a hyperspectral camera 180, the inkjet head 170, and a control unit 160. The plasma treatment device 100 performs plasma treatment on the surface of the treatment target 20. The reflecting light source 181 illuminates the plasma-treated treatment target 20. The hyperspectral camera 180 measures a reflectance spectrum of light reflected from the treatment target 20. The inkjet head 17 forms an image on the treatment target 20 by inkjet recording. The control unit 160 performs overall control of the printing apparatus (system) 1.

Each of high-frequency, high-voltage power sources 151 to 156 applies a high-frequency, high-voltage pulse voltage between one, to which the power source is connected, of discharge electrodes 111 to 116 and a counter electrode 141. The voltage value of the pulse voltage is approximately 10 kV (kilovolts), for example. The frequency of the pulse voltage may be approximately 20 kHz (kilohertz), for example. Atmospheric-pressure non-equilibrium plasma is produced between the discharge electrode 111 and a dielectric 121 by supplying such a high-frequency, high-voltage pulse voltage between the two electrodes.

The dielectric 121 is disposed between the discharge electrodes 111 to 116 and the counter electrode 141. An endless belt is preferably used as the dielectric 121 so that the dielectric 121 also serve to convey the treatment target 20. For this purpose, the plasma treatment device 100 further includes rollers 122 for rotating the dielectric 121 to convey the treatment target 20. The rollers 122 are rotated in accordance with a command fed from the control unit 160, thereby rotating the dielectric 121. The treatment target 20 is conveyed through between the discharge electrode 111 and the dielectric 121 during when the atmospheric-pressure non-equilibrium plasma is produced, and is plasma-treated. During this treatment, chains in binder resin on the surface of the treatment target 20 are broken and, furthermore, oxygen radicals and ozone in the gas phase recombine to polymers, thereby producing polar functional groups on the surface of the treatment target 20. As a result, hydrophilicity and acidity are imparted to the surface of the treatment target 20. Although the plasma treatment is performed in the atmosphere in this example, the plasma treatment may alternatively be performed in a gas atmosphere of nitrogen, a rare gas, or the like.

The control unit 160 can individually turn the high-frequency, high-voltage power sources 151 to 156 on and off. Specifically, the control unit 160 can adjust the number of the discharge electrodes 111 to 116 (i.e., the number of driven electrodes) to be driven by individually turning the high-frequency, high-voltage power sources 151 to 156 on and off. Furthermore, the control unit 160 can adjust the magnitude of the pulse voltage to be supplied from each of the high-frequency, high-voltage power sources 151 to 156 to a corresponding one of the discharge electrodes 111 to 116.

The reflecting light source 181 and the hyperspectral camera 180, which are disposed downstream from the plasma treatment device 100, measure a reflectance spectrum on the surface of the treatment target 20 having undergone the plasma treatment performed by the plasma treatment device 100. Details of the reflecting light source 181 and the hyperspectral camera 180 will be described below.

The inkjet head 170 is disposed downstream of the plasma treatment device 100 on the conveyance path D1 for the treatment target 20. The inkjet head 170 ejects ink under control of the control unit 160 onto the treatment target 20 having undergone the plasma treatment performed by the plasma treatment device 100, thereby forming an image.

The inkjet head 170 may include a plurality of heads for the same color (for example, four heads for each of four colors) to increase print speed, for example. Furthermore, to form an image at a high speed and high resolution (for example, 1,200 dpi (dots per inch)), ink ejection nozzles of the head for each color may be fixed in a staggered arrangement where the nozzles are spaced as desired. Furthermore, the inkjet head 170 may be configured to be driven at any one of a plurality of drive frequencies so that each nozzle can eject a dot (droplet) of ink in any one of three volumes referred to as large, medium, and small droplets.

Disposing the plurality of discharge electrodes 111 to 116 along the conveyance path D1 of the treatment target 20 makes it possible to perform sequential plasma treatment and to adjust a level of plasma treatment (put another way, adjust the intensity of the plasma energy to be applied to the treatment target 20). Disposing the plurality of discharge electrodes 111 to 116 in a direction (i.e., the width direction of the treatment target 20) perpendicular to the conveyance path D1 or, in other words, along the width direction of the treatment target 20, makes it possible to perform plasma treatment partially on the treatment target 20 in the width direction.

Figure 4:
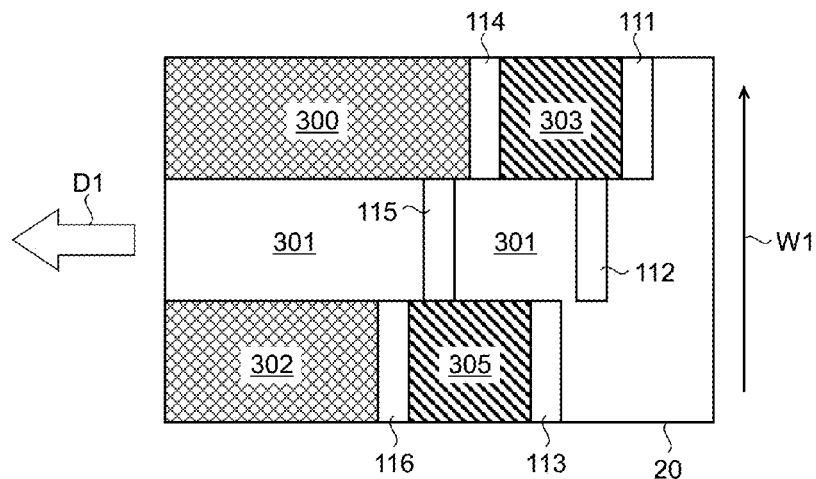
FIG. 4 is a diagram illustrating an example of a treatment result according to the embodiment when discharge electrodes are disposed in three rows in a conveyance path of a treatment target to thereby divide a treatment width into three and perform plasma treatment partially on the treatment target.

FIG. 4 is a diagram illustrating an example of a treatment result when the discharge electrodes 111 to 116 are disposed in three rows along the conveyance path D1 of the treatment target 20 to thereby divide a treatment width into three and perform plasma treatment partially on the treatment target 20, for example. As illustrated in FIG. 4, treated areas 300 and 303 are formed in one of areas, which result from the division of the treatment target 20 into three in a width direction W1, at one end by applying a pulse voltage to the discharge electrodes 111 and 114, which are situated at the one end, of the discharge electrodes 111 to 116 to cause discharge. The treated area 303 is an area treated with plasma produced by the discharge electrode 111, while the treated area 300 is an area treated with plasma produced by both of the discharge electrodes 111 and 114. Similarly, treated areas 302 and 305 are formed in another one of the areas, which result from the division of the treatment target 20 into three in the width direction W1, at the other end by applying a pulse voltage to the discharge electrodes 113 and 116, which are situated at the other end, to cause discharge. The treated area 305 is an area treated with plasma produced by the discharge electrode 113, while the treated area 302 is an area treated with plasma produced by both of the discharge electrodes 113 and 116. An untreated area 301, which is not plasma-treated, is formed by applying no pulse voltage to the discharge electrodes 112 and 115 situated in the center in the width direction W1. Thus, disposing the discharge electrodes 111 to 116 in an array in the width direction W1 of the treatment target 20 makes it possible to adjust the levels of treatment in the width direction.

Figure 5:
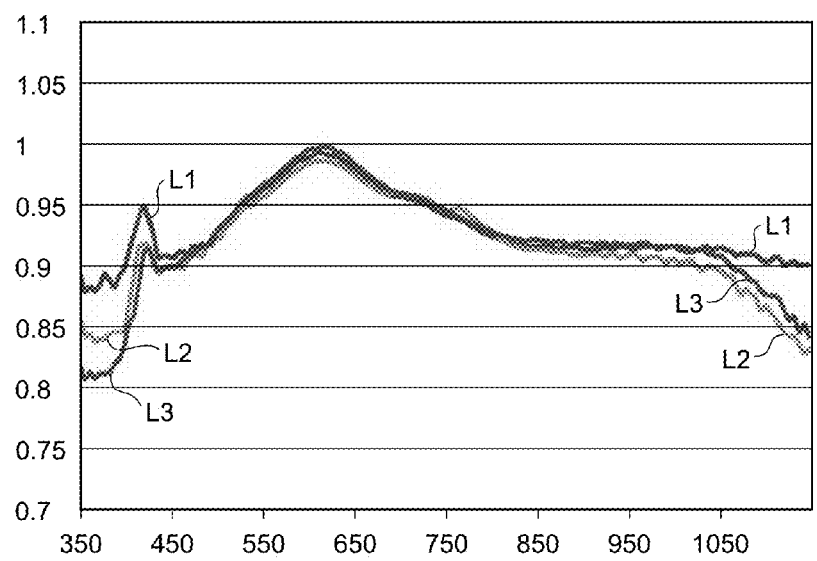
FIG. 5 is a graph of a reflectance spectrum according to the embodiment measured on the treatment target illustrated in FIG. 4 with plasma energy per discharge electrode set to 1 J/m$^2$.

FIG. 5 is a graph of a reflectance spectrum measured on the treatment target illustrated in FIG. 4 with plasma energy per discharge electrode set to 1 J/m$^2$ (joule per square meter). In FIG. 5, reflectance spectrum of the untreated area 301 is indicated by L1; reflectance spectrum of the treated area 300 is indicated by L2; and reflectance spectrum of the treated area 302 is indicated by L3. As the hyperspectral camera 180, NH-7 manufactured by EBA JAPAN CO., LTD. (registered trademark) was used.

As can be seen from FIG. 5, the reflectance of the treated areas 300 and 302 is smaller than the reflectance of the untreated area 301 in a wavelength range at or below 475 nm (e.g., a wavelength range from 350 to 475 nm) and a wavelength range at or above 1020 nm (e.g., a wavelength range from 1020 to 1100 nm). In the wavelength range at or below 475 nm, for example, a drop in reflectance is larger in the treated area 302 where plasma treatment is performed twice than in the treated area 300 where plasma treatment is performed once. It is implied that the greater the plasma energy per unit area applied to the treatment target 20, the greater the reflectance decreases.

Figure 6:
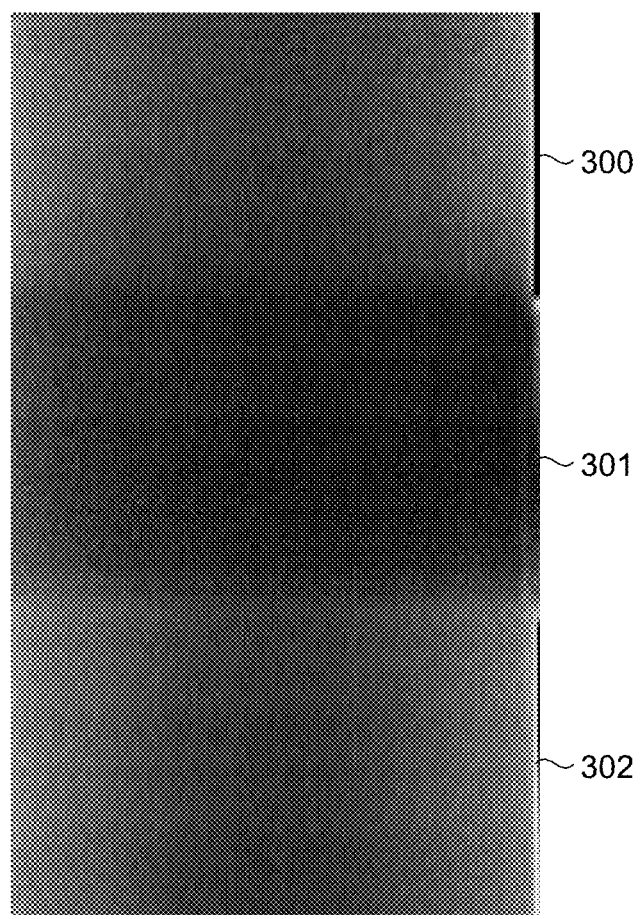
FIG. 6 is a view illustrating a visualized image obtained by performing image processing on treated areas and an untreated area of FIG. 4 based on a reflectance spectrum at a wavelength of 1020 nm.

FIG. 6 is a view illustrating a visualized image obtained by performing image processing on the treated areas 300 and 302 and the untreated area 301 of FIG. 4 based on a reflectance spectrum at a wavelength of 1020 nm. As illustrated in FIG. 6, the treated areas 300 and 302 exhibit lighter color than the untreated area 301. This indicates that the reflectance in the treated areas 300 and 302 is smaller than the reflectance of the untreated area 301. Contact angles of pure water droplets on the respective areas were measured. The contact angle of pure water droplets on the treated areas 300 and 302 was 30 degrees, while the contact angle of a pure water droplet on the untreated area 301 was 70 degrees. This indicates that the treated areas 300 and 302 have higher hydrophilicity than the untreated area 301.

It is possible, using the technique of two-dimensionally observing the treatment target 20, to check a level of plasma treatment on a treated surface of the treatment target 20 at a high resolution using the principle that reflectance depends on a level of plasma treatment in this manner. Hence, even when the level of plasma treatment should partially drop due to defective discharge resulting from the pollution of the electrode or the like, it is possible to identify the portion where the level has dropped, the electrode causing the defective discharge, or the like.

Furthermore, a configuration for compensation to maintain uniformity of plasma treatment is achievable by evaluating uniformity of plasma treatment by two-dimensionally observing the treatment target 20. Specifically, it is possible to equalize reflectance across the entire treated surface of the treatment target 20 by feedback- or feedforward-controlling the high-frequency, high-voltage power sources 151 to 156 based on information (a reflectance spectrum) about reflectance at each of positions (e.g., coordinates) on the treated surface. Furthermore, it is also possible to adjust the level of plasma treatment (plasma energy) across the entire to-be-treated surface by controlling the high-frequency, high-voltage power sources 151 to 156 so as to maintain reflectance at or below a predetermined value at each of the positions. For instance, the predetermined reflectance value at a wavelength of 415 nm may be 0.93.

A visualized image as illustrated in FIG. 6 can also be obtained by performing image processing based on a reflectance spectrum of light of a wavelength in a wavelength range at or below 475 nm, for example. A visualized image more accurately representing a result of plasma treatment can be obtained by performing image processing based on both a reflectance spectrum of light of a wavelength in a wavelength range at or below 475 nm and a reflectance spectrum of light of a wavelength in a wavelength range at or above 1020 nm, for example. Correction to maintain uniformity of plasma treatment performed on the treatment target 20 is enabled by evaluating uniformity of plasma treatment performed on the treatment target 20 using one or more wavelengths or wavelength ranges where variation in reflectance is produced between before and after the plasma treatment in this manner.

Details of the reflecting light source 181 and the hyperspectral camera 180 illustrated in FIG. 3 are described below. The hyperspectral camera 180 measures surface reflectance of the treatment target 20 in a contactless manner, for example. The reflecting light source 181 irradiates the treatment target 20 with light of an appropriate intensity satisfying a measurement condition based on a signal fed from the control unit 160. In the embodiment, a halogen lamp is used as the reflecting light source 181. Alternatively, any one of various light sources including a fluorescent lamp, a black light source, and infrared light source can be used depending on a purpose.

Figure 7:
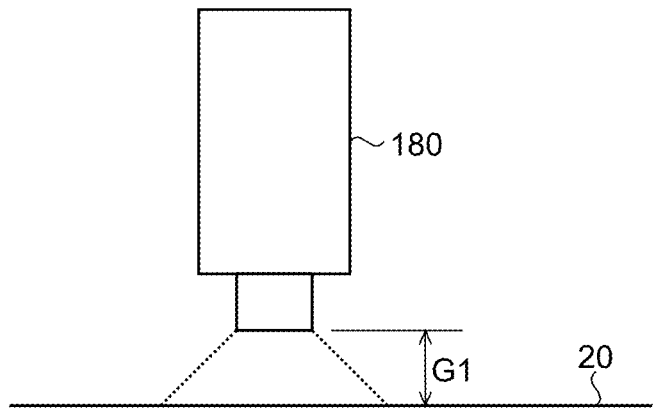
FIG. 7 is a view illustrating a field of view of a hyperspectral camera with the distance between the treatment target and the hyperspectral camera set to a first distance according to the embodiment.
Figure 8:
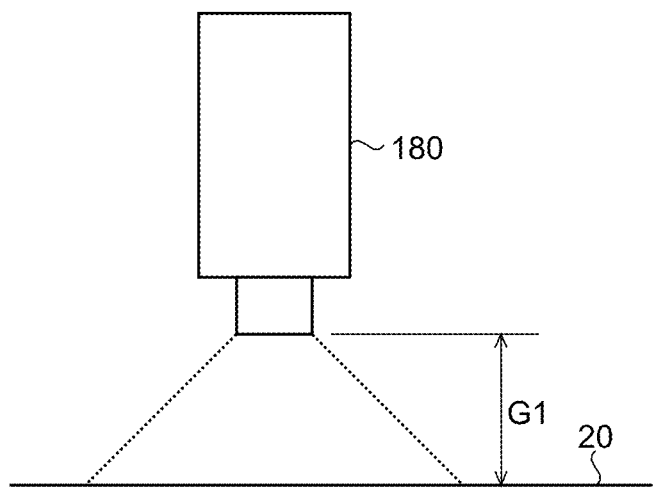
FIG. 8 is a view illustrating a field of view of the hyperspectral camera with the distance between the treatment target and the hyperspectral camera set to a second distance according to the embodiment.

It is possible to measure a reflectance spectrum for different purposes by changing a distance G1 between the treatment target 20 and the hyperspectral camera 180. For instance, when it is desired to inspect the treatment target 20 in detail, an image may preferably be captured with the hyperspectral camera 180 positioned in proximity of the treatment target 20 as illustrated in FIG. 7; whereas, when it is desired to evaluate overall uniformity quickly, an image may preferably be captured with the hyperspectral camera 180 positioned away from the treatment target 20 as illustrated in FIG. 8.

Figure 9:
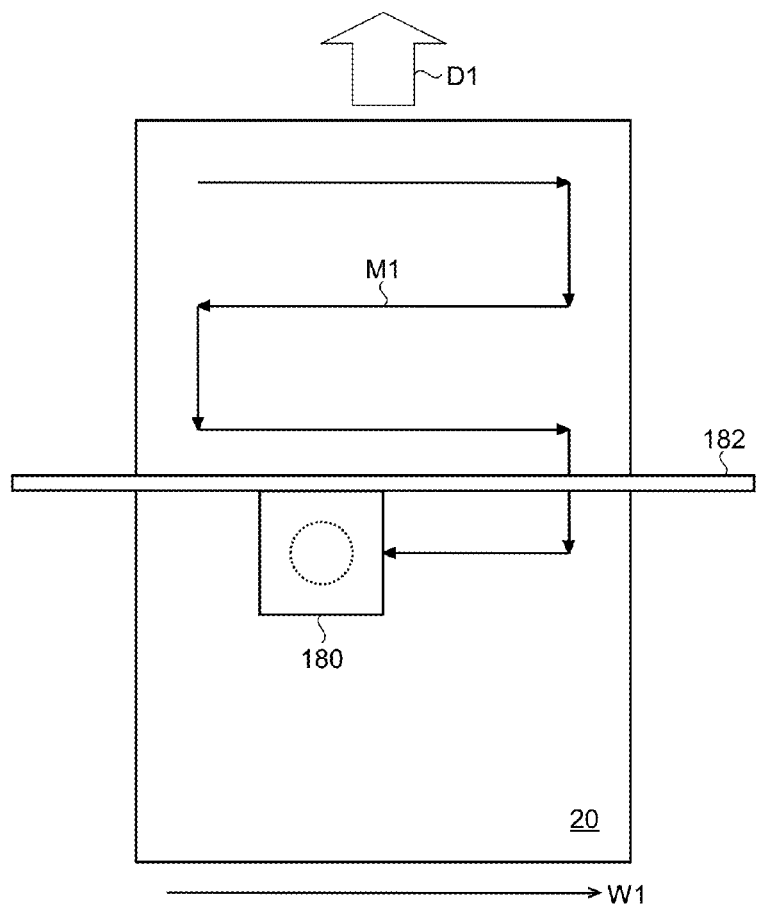
FIG. 9 is a diagram for describing a method of shuttling the hyperspectral camera back and forth in a direction perpendicular to a conveying direction to capture an image according to the embodiment.
Figure 10:
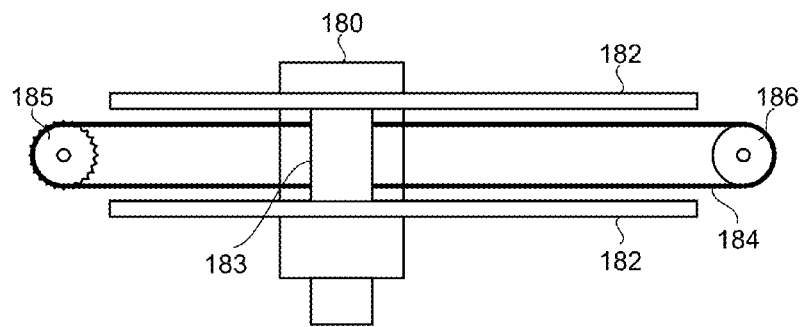
FIG. 10 is a view illustrating an example mechanical structure for shuttling the hyperspectral camera back and forth according to the embodiment.

As another method for capturing an image of a wide area at a high resolution, for instance, a method of shuttling the hyperspectral camera 180 back and forth in the direction (i.e., the width direction W1 of the treatment target 20) perpendicular to the conveying direction D1 and capturing an image as illustrated in FIG. 9 can be used. Shuttling the hyperspectral camera 180 in the width direction W1 can be implemented by a mechanical structure as illustrated in FIG. 10. In the structure illustrated in FIG. 10, a slider 183 disposed on the hyperspectral camera 180 is slidably fitted in a pair of guide rails 182 extending in the width direction W1. A drive force for shuttling the hyperspectral camera 180 back and forth using the slider 183 is transmitted from a gear 185 to a timing belt 184, for example. The timing belt 184 is fixed to the slider 183 at one point. The timing belt 184 is entrained around the gear 185 and a pulley 186 to apply a necessary and sufficient tension to the timing belt 184. With this structure, it is possible to shuttle the hyperspectral camera 180 back and forth by alternately applying a forward-rotation drive force and a backward-rotation drive force to the gear 185. At this time, the treatment target 20 is moved a predetermined distance in the conveying direction D1 each time switching between forward rotation and backward rotation of the gear 185 occurs. Thus, the hyperspectral camera 180 can be moved relative to the treatment target 20 as indicated by arrows M1 in FIG. 9.

The reflectance spectrum measured by the hyperspectral camera 180 is fed to the control unit 160. When the hyperspectral camera 180 is shuttled back and forth as illustrated in FIG. 9, it is possible to visualize a reflectance spectrum of an area (e.g., the entire treated surface) wider than a field of view of the hyperspectral camera 180 at a high resolution by repeatedly moving the hyperspectral camera 180, stopping the hyperspectral camera 180, capturing images, and merging, by the control unit 160, the thus-measured local reflectance spectra.

The control unit 160 evaluates reflectance uniformity based on the reflectance spectrum fed to the control unit 160 and adjusts the number of the discharge electrodes 111 to 116 to be driven and/or the plasma energy of the pulse voltages supplied from the high-frequency, high-voltage power sources 151 to 156 to the discharge electrodes 111 to 116 according to a result of the evaluation.

As a method for increasing the level of the plasma treatment performed on the surface of the treatment target 20, a method of increasing duration of plasma treatment per unit area is conceivable. Increasing the plasma treatment duration is achievable by, for example, decreasing the conveyance velocity of the treatment target 20. However, reducing the plasma treatment duration is desired when image recording on the treatment target 20 is performed at a high speed. Example methods usable to reduce the plasma treatment duration include a method of, as described above, disposing the plurality of discharge electrodes 111 to 116 and driving a necessary number of the discharge electrodes 111 to 116 depending on a print speed and required reflectance and a method of adjusting the intensity of plasma energy supplied to the respective discharge electrodes 111 to 116. However, the method is not limited to these methods, and can be modified as appropriate. For example, a combination of these methods or another method can be used.

Figure 11:
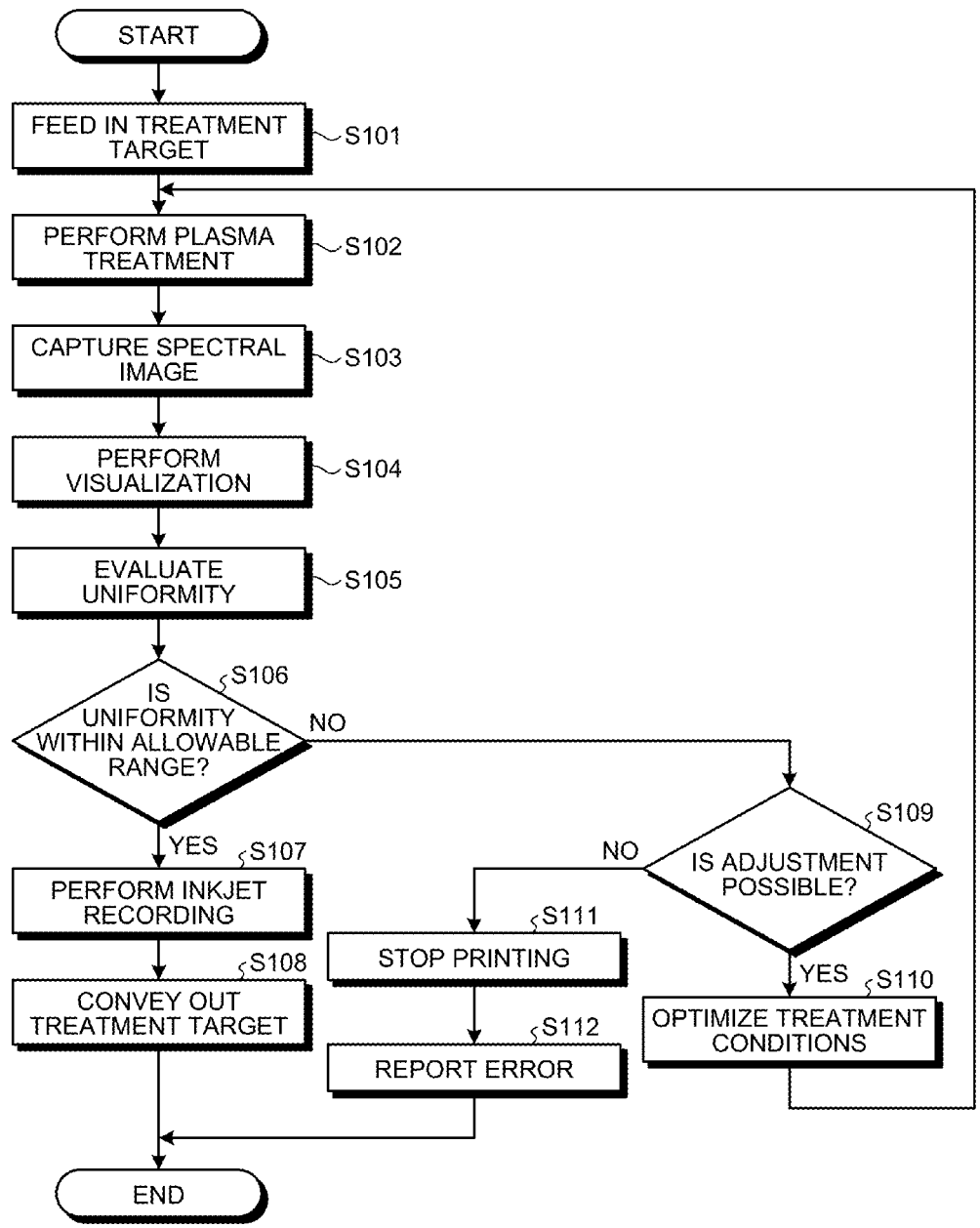
FIG. 11 is a flowchart illustrating an example of a printing process including hydrophilization treatment according to the embodiment.

FIG. 11 is a flowchart illustrating an example of a printing process including the hydrophilization treatment (plasma treatment) according to the embodiment. FIG. 11 illustrates an example where the printing apparatus (system) 1 including the plasma treatment device 100 illustrated in FIG. 3 performs printing on a sheet of cut paper (a recording medium cut into a predetermined size), which is the treatment target 20. The recording medium is not limited to cut paper; printing can be performed similarly on roll paper, which is paper rolled into a roll.

The printing process is performed as illustrated in FIG. 11. The control unit 160 drives the rollers 122 to rotate the dielectric 121, thereby feeding the treatment target 20, which has been conveyed onto the dielectric 121 from upstream, into the plasma treatment device 100 (S101). Thereafter, the control unit 160 drives the high-frequency, high-voltage power sources 151 to 156 to supply pulse voltages to the discharge electrodes 111 to 116, thereby performing plasma treatment (S102). The plasma treatment is performed in the following manner. If a result of measurement is not fed from the hyperspectral camera 180, the control unit 160 supplies plasma energy of a predetermined intensity to the discharge electrodes 111 to 116. On the other hand, if a result of measurement is fed from the hyperspectral camera 180, the control unit 160 adjusts the number of the high-frequency, high-voltage power sources 151 to 156 to be driven according to the measurement result. At this time, the control unit 160 may further adjust the plasma energy to be supplied to each of the discharge electrodes 111 to 116.

Thereafter, the control unit 160 drives the reflecting light source 181 and the hyperspectral camera 180 to capture an image of the plasma-treated treatment target 20 (S103) and performs image processing thereon to visualize the obtained reflectance spectrum (S104). In the visualization processing, reflectance spectra values obtained by the hyperspectral camera 180 are converted into grayscale tonal values on a pixel-by-pixel basis, thereby obtaining a visualized two-dimensional mapping image. The conversion from the values of the reflectance spectrum into the tonal values can be performed using a conversion equation determined by initial settings, which will be described below with reference to FIG. 12, for example. Thereafter, the control unit 160 analyzes the obtained visualized image to evaluate uniformity of the plasma treatment (S105). Evaluation of the uniformity of the plasma treatment is made based on, for example, variation in tonal values of the respective pixels.

Thereafter, the control unit 160 determines whether or not the uniformity of the plasma treatment is within an allowable range (S106). If the uniformity is not within the allowable range (NO at S106), the control unit 160 determines whether or not adjustment is possible by changing plasma treatment conditions (S109). The control unit 160 determines that adjustment is possible when, for example, it is judged that it is possible to bring the uniformity into the allowable range by adjusting the number of the high-frequency, high-voltage power sources 151 to 156 to be driven, the intensity of the plasma energy to be supplied to the respective discharge electrodes 111 to 116, the conveyance velocity (linear velocity), and/or the like. The control unit 160 determines that adjustment is impossible when, for example, a foreign matter sticking to the discharge electrodes 111 to 116 or the counter electrode 141, or the like makes discharge unstable and causes thin-stripe-shaped treatment unevenness.

If the control unit 160 determines that adjustment is possible (YES at S109), the control unit 160 optimizes the number of the high-frequency, high-voltage power sources 151 to 156 to be driven, the intensity of the plasma energy to be supplied to the respective discharge electrodes 111 to 116, the conveyance velocity (linear velocity), and/or the like (S110). Processing then returns to S102. Consequently, because distribution of the plasma energy over the treatment target 20 is equalized, uniformity of the surface, which is treated with the plasma, of the treatment target 20 is increased. On the other hand, if the control unit 160 determines that adjustment is impossible (NO at S109), the control unit 160 stops the printing process (S111), reports the error of the printing process to a user (S112), and completes the operation.

If the control unit 160 determines that the uniformity of the plasma treatment is within the allowable range at S106 (YES at S106), the control unit 160 drives the inkjet head 170 to perform an inkjet recording process on the plasma-treated treatment target 20 (S107). Thereafter, the control unit 160 conveys out the treatment target 20 from the inkjet head 170 downstream (S108), and completes the operation.

The control unit 160 may alternatively be configured such that, if the control unit 160 determines that the uniformity is not within the allowable range at S105, the control unit 160 routes the treatment target 20 through a bypass route (not illustrated) to perform plasma treatment again on the same treatment target 20 (S102). Thereby, the treatment target 20 can be prevented from being wasted. Further, even when a plurality of types of recording media that differ in property are used as the treatment target 20, the treatment can be performed by a similar procedure.

A configuration for locally performing plasma treatment based on print image data in advance and checking the corresponding area having been plasma-treated using the hyperspectral camera 180, and performing a printing process can be used. This configuration allows omitting application of plasma treatment to an unnecessary area, thereby achieving reduction of power consumption.

Figure 12:
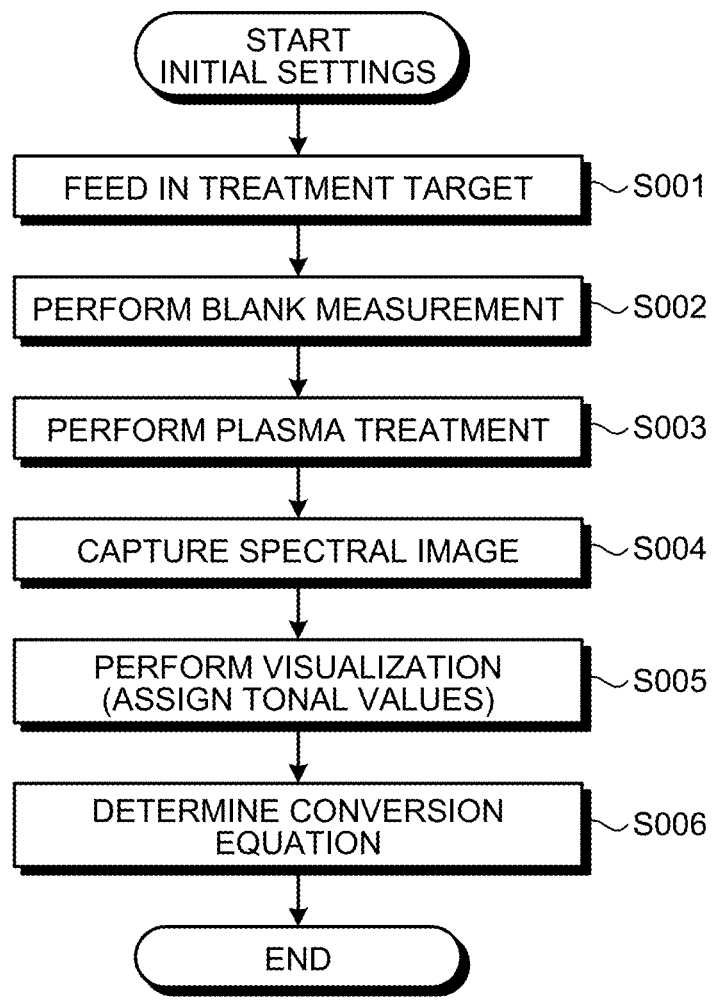
FIG. 12 is a flowchart illustrating an example of an initial setting operation according to the embodiment.

Initial settings for evaluating uniformity of plasma treatment are described in detail below with reference to FIG. 12. An initial setting operation for evaluating uniformity of plasma treatment is performed as illustrated in FIG. 12. The feed-in unit 30 feeds in the treatment target 20 onto the conveyance path first (S001). The fed-in treatment target 20 is moved through the plasma treatment device 100, without being plasma-treated, into the field of view of the hyperspectral camera 180 and the hyperspectral camera 180 measures a reflectance spectrum (S002). The reflectance spectrum obtained by making measurement (blank measurement) of the not-plasma-treated treatment target 20 are used as offset (also called "background") of respective pixels in evaluation of the uniformity.

Thereafter, the control unit 160 drives the plasma treatment device 100 to perform plasma treatment on the treatment target 20 (S003). The treatment target 20 to be treated at this time may be either the treatment target 20 having undergone the blank measurement at S002 and conveyed in reverse or the treatment target 20 newly fed in by the feed-in unit 30. At S003, alternatively, a sample treated with high plasma energy per unit area may be prepared by conveying the treatment target 20 at a minimum conveyance velocity, for example. At that time, a sample where intensity of applied plasma energy varies from one area to another may be prepared by causing the number of the discharge electrodes 111 to 116 to be used to vary stepwise.

The treatment target 20 (or the sample) plasma-treated as described above is moved into the field of view of the hyperspectral camera 180 and an image of the treatment target 20 is captured (S004). The control unit 160 performs image processing on the reflectance spectrum obtained by capturing the image to perform visualization (S005). Various methods can be used as a method for assigning tonal values in the visualization. Examples of the usable various methods include a method of proportionally distributing tonal values to reflectivities, in which a tonal value of 255 is assigned to reflectivity of an untreated area where plasma treatment is not performed and a tonal value of 0 is assigned to an area where reflectivity is lowest among treated areas, and a method of calculating the slope from reflectivity at 1100 nm and reflectivity at 950 nm and performing image processing with a tonal value of 255 assigned to a slope of 0 and a tonal value of 0 assigned to a slope of infinity.

Thereafter, the control unit 160 determines a conversion equation for conversion between tonal values (i.e., values of the reflectance spectrum) and plasma energy based on the plasma energy applied to the treatment target 20 on a per-area basis (or on a per-pixel basis) and tonal values of the areas (or the pixels) (S006), and completes the initial setting operation.

In the embodiment, the visualization is performed with reference to the reflectance spectrum at 1050 nm where the treatment target is less likely to be affected by fluorescent dyes contained in paper. For a treatment target, such as a film, which does not contain a fluorescent dye, near-ultra-violet reflectance spectrum at or near 350 nm may be used.

When roll paper is used as the treatment target 20, the initial settings illustrated in FIG. 12 may be performed using a leading-end portion of the roll paper fed by a paper feeder (not illustrated). Roll paper has approximately uniform properties across the entire length. Accordingly, when roll paper is used, once plasma energy is adjusted using a leading end portion of the roll paper, continuous printing can be performed stably without changing the initial settings. However, if printing should be suspended for a long period of time before all the roll paper is used up, the properties of the paper can change. In this case, it is preferable to perform the initial settings using a leading-end portion in a similar manner before resuming printing. Alternatively, a configuration where, after a reflectance spectrum of a plasma-treated leading-end portion have been measured and plasma energy has been adjusted based on the reflectance spectrum, measurement of a reflectance spectrum and adjustment of plasma energy are performed at regular intervals or continuously may be employed. This configuration allows performing control more minutely and stably.

As described above, according to the embodiment, because it is possible to obtain two-dimensional distribution of a reflective spectrum of the plasma-treated treatment target 20 and adjust conditions for plasma treatment based on the two-dimensional distribution, uniformity of the treatment can be increased. As a result, because stable hydrophilization treatment can be performed, favorable image recording can be performed stably.

The hyperspectral camera 180 described in the embodiment has the sensitivity range of from 350 to 1050 nm. However, further increase in sensitivity or application to precoated paper is enabled by using the hyperspectral camera 180 having a wider sensitivity range and selecting the reflecting light source 181 of an appropriate wavelength range.

According to an embodiment, a treatment-target modification device, a treatment-target modification system, an image forming system, and an image forming method that enable high-quality printing can be realized.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

The method steps, processes, or operations described herein are not to be construed as necessarily requiring their performance in the particular order discussed or illustrated, unless specifically identified as an order of performance or clearly identified through the context. It is also to be understood that additional or alternative steps may be employed.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. A treatment-target modification device configured to modify a treatment target being conveyed, with discharge, the treatment-target modification device comprising:
   a hydrophilization unit configured to perform hydrophilization treatment on the treatment target; and
   a measurement unit configured to measure two-dimensional distribution of a reflectance spectrum of light reflected from the hydrophilization-treated treatment target after the hydrophilization unit has performed the hydrophilization treatment thereupon, and before inkjet recording is performed on the hydrophilization-treated treatment target.

2. The treatment-target modification device according to claim 1, wherein the measurement unit measures the reflectance spectrum of at least one of light in a wavelength range at or below 475 nm and light in a wavelength range at or above 1020 nm.

3. The treatment-target modification device according to claim 1, wherein the measurement unit is a hyperspectral camera.

4. The treatment-target modification device according to claim 1, wherein the hydrophilization treatment is any one of corona treatment and plasma treatment, the corona treatment modifying the treatment target with corona discharge, the plasma treatment modifying the treatment target with plasma.

5. The treatment-target modification device according to claim 1, wherein the hydrophilization treatment is atmospheric-pressure non-equilibrium plasma treatment.

6. A treatment-target modification system comprising:
   the treatment-target modification device according to claim 1; and
   a control unit configured to control the hydrophilization unit based on the two-dimensional distribution of the reflectance spectrum measured by the measurement unit.

7. The treatment-target modification system according to claim 6, wherein
   the hydrophilization unit includes a plurality of electrodes configured to generate the discharge, and
   the control unit selects one or more electrodes used to generate the discharge, from the plurality of electrodes, based on the two-dimensional distribution of the reflectance spectrum.

8. The treatment-target modification system according to claim 6, wherein the control unit converts values of the reflectance spectrum into tonal values to generates a visualized image from the two-dimensional distribution of the reflectance spectrum, evaluates uniformity of the hydrophilization treatment performed on the treatment target based on the generated visualized image, and controls the hydrophilization unit according to a result of the evaluation.

9. An image forming system comprising:
   the treatment-target modification system according to claim 6; and
   a recording unit configured to perform inkjet recording on the treatment target having undergone the hydrophilization treatment performed by the hydrophilization unit.

10. An image forming method for forming an image on a treatment target by inkjet recording, the image forming method comprising:
    performing hydrophilization treatment on the treatment target;
    measuring two-dimensional distribution of reflectance spectrum of light reflected from the hydrophilization-treated treatment target after the hydrophilization unit has performed the hydrophilization treatment thereupon, and before inkjet recording is performed on the hydrophilization-treated treatment target;
    adjusting treatment conditions for the hydrophilization treatment based on the two-dimensional distribution of the reflectance spectrum measured at the measuring; and
    performing inkjet recording on the hydrophilization-treated treatment target in accordance with the treatment conditions adjusted at the adjusting.

* * * * *